United States Patent
Oura et al.

(10) Patent No.: US 6,194,063 B1
(45) Date of Patent: Feb. 27, 2001

(54) HEAT-CONDUCTIVE AND PRESSURE-SENSITIVE ADHESIVE SHEETS AND METHOD FOR FIXING ELECTRONIC PARTS TO HEAT-RADIATING MEMBERS WITH THE USE OF THE SAME

(75) Inventors: Masahiro Oura; Kazuyuki Kitakura; Takao Yoshikawa, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/225,360

(22) Filed: Jan. 5, 1999

(30) Foreign Application Priority Data

Jan. 5, 1998 (JP) .................................................. 10-000558

(51) Int. Cl.$^7$ ....................................................... B32B 7/12
(52) U.S. Cl. ...................... 428/343; 428/354; 428/474.4; 427/208
(58) Field of Search ..................... 428/343, 344, 428/354, 458, 473.5, 355 AC, 474.4; 427/208

(56) References Cited

U.S. PATENT DOCUMENTS

| | | | |
|---|---|---|---|
| 3,881,049 | * 4/1975 | Brandt et al. ................. | 428/458 |
| 4,463,055 | * 7/1984 | Hodges ......................... | 428/458 |
| 4,810,563 | * 3/1989 | Degree .......................... | 428/209 |
| 5,035,945 | * 7/1991 | Hart .............................. | 428/323 |
| 5,178,957 | * 1/1993 | Kolpe ............................ | 428/458 |
| 5,213,868 | 5/1993 | Liberty et al. ................ | 428/1.31 |
| 5,298,791 | 3/1994 | Liberty et al. ................ | 257/707 |

FOREIGN PATENT DOCUMENTS

| | | |
|---|---|---|
| 26 19 433 | 11/1977 | (DE) . |
| 91 13 276 | 3/1992 | (DE) . |
| 0 322 165 | 6/1989 | (EP) . |
| 0556 093 A1 | 4/1992 | (EP) . |
| 2 219 133 | 11/1989 | (GB) . |
| 96 37915 | 11/1996 | (WO) . |

\* cited by examiner

*Primary Examiner*—Terrel Morris
*Assistant Examiner*—Frederick G. Dean
(74) *Attorney, Agent, or Firm*—Sughrue, Mion, Zinn, Macpeak & Seas, PLLC

(57) ABSTRACT

The present invention provides a heat-conductive and pressure-sensitive adhesive sheet comprising an electrical insulating plastic film having formed on one or both of the surfaces thereof (1) at least one thin layer composed of an inorganic material selected from the group consisting of ceramics, metals and metal oxides other than ceramics, and (2) a pressure-sensitive adhesive composition layer formed on the thin layer. The heat-conductive and pressure-sensitive adhesive sheet is excellent in heat-conductivity and pressure-sensitivity, results in no trouble such as complicated procedures in the production process or worsened working environment, exhibits good adhesion between the base material and the pressure-sensitive adhesive composition layer, scarcely undergoes anchoring fracture between the base material even after allowing to stand at high temperatures for a long time, and has good heat resistance.

8 Claims, No Drawings

HEAT-CONDUCTIVE AND PRESSURE-SENSITIVE ADHESIVE SHEETS AND METHOD FOR FIXING ELECTRONIC PARTS TO HEAT-RADIATING MEMBERS WITH THE USE OF THE SAME

FIELD OF THE INVENTION

This invention relates to heat-conductive and pressure-sensitive adhesive sheets in the form of sheets, tapes, etc. which are to be used in, for example, fixing electronic parts, in particular, fixing an electronic part to a heat-radiating member, and for fixing members in various fields such as building materials, vehicles, aircrafts and ships.

BACKGROUND OF THE INVENTION

With an increase of integration of IC circuits, heat value is increased in electronic parts such as hybrid packages, multimodules, and sealed-type integrated circuits with plastics and metals. Since the increase of temperature due to the increased heat value may cause malfunction of the electronic parts, a countermeasure for preventing the malfunction by attaching a heat-radiating member such as a heat sink to the electronic part has been taken.

As a method for providing electronic parts with heat-radiating members, a method which comprises using an adhesive prepared by adding aluminum powder etc. to a composition comprising a polymerizable acrylate monomer and a free radical initiator is proposed in U.S. Pat. No. 4,722,960. In this method, after the adhesive is applied onto one or both of the electronic part and the heat-radiating member, it is necessary to effect curing treatment using a primer or blocking oxygen. Such an adhesion treatment needs a long time and much labor, and the materials to be adhered have to be fixed temporally until the completion of curing, thereby resulting in poor efficiency in producing the electronic devices.

Further, U.S. Pat. No. 4,606,962 proposes to use adhesive tape which has an adhesive layer containing silver grains having a diameter exceeding the thickness of the layer. When silver grains are added in the process of the preparation of the adhesive composition, the viscosity of the composition is extremely increased and, as a result, the composition becomes poor in flowability and handling properties, in particular, coating workability. When such a composition is formed into a tape, no thickness accuracy can be achieved, and in the worst case, no tape can be obtained.

Also, JP-A-6-88061 corresponding to EP 566093 A1 (the term "JP-A" as used herein means an "unexamined published Japanese patent application") discloses a method with the use of heat-conductive and electrical insulating tapes comprising alkyl acrylate polymers containing polar monomers in which heat-conductive and electrical insulating grains are dispersed at random. With the recent increase of integration of member packaging, high electrical insulating properties are needed in such tapes for electronic parts. However, the above-mentioned heat-conductive and electrical insulating tapes have no base material, which makes it impossible to regulate pinholes in the sheets. Moreover, it is feared that the terminal of an electronic part might penetrate into the pressure-sensitive adhesive and thus seriously deteriorate the electrical insulating properties (volume resistivity, breakdown voltage). Therefore, the above-mentioned heat-conductive and electrical insulating tapes are unusable in sites where a high reliability is needed.

On the other hand, as a heat-conductive interfacial material located between a heat source and a radiator, JP-A-5-198709 (U.S. Pat. No. 5,213,868) proposes a heat-conductive material comprising, as a base material, a plastic film (made of nylon, polyesters, polyamides, polyimides, etc.) optionally containing aluminum oxide or boron nitride and a layer of a pressure-sensitive acrylic adhesive containing a heat-conductive filler formed thereon. The material is perforated, embossed or grooved so as to remove the air between the heat source and the radiator. However, these materials are poor in the adhesion between the base material and the pressure-sensitive adhesive layer and suffer from a problem of peeling between these members when used at high temperatures, i.e., anchoring fracture.

It is frequently attempted in the art to form one or more undercoating layers between a base material and a pressure-sensitive adhesive layer so as to improve the adhesion between them. This treatment comprises using an undercoating material having a polarity between those of the base material and the pressure-sensitive layer, dissolving the material in, for example, an organic solvent, and then applying it onto the base material followed by drying. However, the application of this method to the above-mentioned heat-conductive materials, etc. suffers from some troubles such as a need for complicated operations and worsened working environment due to the use of the organic solvent. It is also known to improve the adhesion by a dry system such as corona discharge treatment or sputtering. However, such a system is not available in practice, since it can achieve only insufficient effects or the thus achieved effects are deteriorated with the passage of time.

Considering the above-mentioned problems encountering in the prior arts, the present invention aims at providing heat-conductive and pressure-sensitive adhesive sheets which are to be used in, for example, fixing electronic parts to heat-radiating members and can achieve the above-mentioned objects of fixing while needing neither a long time nor much labor in adhesion. The heat-conductive and pressure-sensitive adhesive sheets of the present invention, which are composed of a base material and a pressure-sensitive adhesive composition layer formed thereon, are excellent in pressure-sensitive adhesion and heat conductivity, result in no troubles such as complicated operations or worsened working environment during the production thereof, show excellent adhesion between the base material and the pressure-sensitive adhesive composition layer, scarcely undergo anchoring fracture between them even after allowing to stand at high temperatures for a long time and have excellent heat resistance.

In order to achieve the above-mentioned object, the present inventors have conducted extensive studies and, as a result, have achieved the present invention based on the finding that heat-conductive and pressure-sensitive adhesive sheets having excellent pressure-sensitive adhesion and heat conductivity, showing improved adhesion of the adhesive layer to the base material, scarcely undergoing anchoring fracture between the base material and the adhesive layer even after allowing to stand at high temperatures for a long time, and having a high heat resistance can be obtained, without resort to the above-mentioned undercoating which causes troubles such as complicated operations or worsened working environment, by forming a specific thin layer on a base material made of an electrical insulating plastic film and then forming a pressure-sensitive adhesive composition layer thereon.

SUMMARY OF THE INVENTION

Accordingly, the present invention relates to a heat-conductive and pressure-sensitive adhesive sheet comprising an electrical insulating plastic film having formed on one or both of the surfaces thereof (1) at least one thin layer composed of an inorganic material selected from the group consisting of ceramics, metals and metal oxides other than ceramics, and (2) a pressure-sensitive adhesive composition layer formed on the thin layer, and a method for fixing electronic parts to heat-radiating members which comprises adhering and fixing the electronic parts to the heat-radiating members via the heat-conductive and pressure-sensitive adhesive sheet.

DETAILED DESCRIPTION OF THE INVENTION

Examples of the base material which can be used in the present invention include an electrical insulating plastic films made of polyimides(amides), polyester (polyethylene terephthalate, polyethylene naphthalate, etc.), fluoroplastics (polytetrafluoroethylene, etc.), polyether ketones, polyether sulfones, polymethylpentene, polyether imides, polysulfones, polyphenylene sulfide, polyester imides, aromatic polyamides, polypropylene and polyethylene. The electrical insulating plastic films having a thickness of from 12 µm to 4 mm can be generally used. From the viewpoints of heat dimensional stability and reliability on heat resistance over a long time, polyimide(amide) films and fluoroplastic films are preferred, and polyimide(amide) films, i.e., polyimide films or polyamide films, are more preferred.

The electrical insulating plastic film may contain a filler to improve the adhesion thereof to the pressure-sensitive adhesive composition layer via the thin layer of the inorganic material. Examples of the filler include $SiO_2$, $TiB_2$, BN, $Si_3N_4$, $TiO_2$, MgO, NiO, CuO, $Al_2O_3$, and $Fe_2O_3$. From the viewpoints of heat conductivity and availability, it is preferred to use BN (boron nitride) or $Al_2O_3$ (aluminum oxide) as the insulating filler. These fillers generally have a particle diameter of from 0.5 to 250 µm, preferably from 1 to 100 µm and more preferably from 2 to 10 µm. These particles maybe in any form such as spheres, needles, flakes or stars. The content of the filler in the film ranges from 2 to 50% by volume, preferably from 10 to 35% by volume.

In the present invention, the above-mentioned electrical insulating plastic film optionally containing a filler can be prepared in accordance with a well known method for forming films. Alternatively, use may be made of commercially available products. For example, "KAPTON MT" manufactured by Du Pont-Toray Co., Ltd., which is a polyimide film containing $Al_2O_3$, is usable as such as the electrical insulating plastic film in the present invention.

In the present invention, a thin layer of an inorganic material selected from among ceramics, metals and metal oxides other than ceramics is formed on one or both of the surfaces of the electrical insulating plastic film. The thin layer can be formed by using well known film-forming techniques, for example, deposition methods (sputtering method, vacuum metallization method, molecular beam epitaxy method, ionizing metallization method, laser application method, heat CVD method, plasma CVD method, organometallic gas phase growth method, discharge polymreization method, liquid phase epitaxy method, LB method, sol/gel method, plating method, etc.) or base material-penetration methods (oxidization methods, diffusion method, ion-injection method, etc.). The thin layer generally has a thickness of from 10 to 1,000 A, preferably from 100 to 500 A, but an appropriate layer thickness can be selected depending on the material of the thin layer and the film-forming technique without being restricted thereto. The thin layer may be a single-layer structure or a multilayer-structure composed of two or more layers laminated thereon.

Examples of the materials usable for forming the thin layer include various ceramics such as silicon oxide, silicon nitride, zirconium oxide, titanium oxide, titanium boride, boron nitride and aluminum oxide; metals such as gold, silver, copper, platinum, palladium, cobalt, nickel, aluminum, magnesium, indium, tin, cadmium, zinc, antimony, silicon and titanium; and oxides of these metals (other than the ceramics) such as indium oxide, tin oxide, antimony oxide; and mixtures thereof (including oxides mixtures). Among the inorganic materials, it is preferred to use those having electrical insulating properties from the viewpoint of insulating reliability.

In the present invention wherein the pressure-sensitive adhesive composition layer is thus formed on the base material via the thin layer of the inorganic material, the adhesion of the pressure-sensitive adhesive composition layer to the base material is extremely improved, compared with the conventional dry systems with the use of the corona discharge treatment, etc. Moreover, the heat-conductive and pressure-sensitive adhesive sheet of the present invention shows sustained effects over a long time, scarcely undergoes anchoring fracture between the base material and the pressure-sensitive adhesive composition layer even after allowing to stand at high temperatures for a long time, and has an excellent heat resistance. These advantages are seemingly established owing to the surface polarity of the above-mentioned thin layer. The thin layer of the inorganic material can be easily formed by the well known film-forming techniques as described above with little need of complicated procedures as required in the conventional undercoating method with the use of organic solvents. Furthermore, the heat-conductive and pressure-sensitive adhesive sheet of the present invention is free from any problem in environmental hygiene caused by the use of organic solvents. In addition, the above-mentioned thin layer of the inorganic material establishes favorable results in heat conduction not only in the thickness direction but also in the face direction, thus contributing to the improvement in heat conductivity.

As the pressure-sensitive adhesive composition to be used in the present invention, it is possible to employ well known compositions containing an appropriate polymer such as rubber, synthetic resins and silicone resins. When the adhesion to the base material is taken into consideration, it is most desirable to use those containing alkyl (meth)acrylate polymers as the base polymer, since the polarity thereof can be easily controlled. Examples of such polymers include homopolymers and copolymers of alkyl (meth)acrylate monomers having $C_{2-14}$ alkyl groups optionally together with monomers copolymerizable therewith for modification such as (meth)acrylic acid, itaconic acid, acrylonitrile, hydroxyethyl (meth)acrylate, vinyl acetate and styrene.

The alkyl (meth)acrylate polymers can be synthesized by block polymerization, solution polymerization, emulsion polymerization, suspension polymerization, etc. Among these polymerization methods, it is preferable to employ the block polymerization method in which the polymerization is effected with irradiation of radiation such as UV light or electron beams. This polymerization method is free from troubles such as corrosion of electronic parts due to residual organic solvents, swelling, peeling or deviation caused by vaporization and swelling at high temperatures, and contamination, insufficient adhesion or decrease in moisture resistance caused by bleeding of emulsifiers. The molecular weight of the resultant polymer can be increased by irradiating relatively weak UV light, thereby providing a pressure-sensitive adhesive composition having a particularly excellent heat resistance while having a high degree of crosslinkage and high cohesive force. The alkyl (meth) acrylate polymer generally has a weight-average molecular weight of approximately from 100,000 to 6,000,000.

To elevate the shear strength, the pressure-sensitive adhesive composition to be used in the present invention may further contain an external crosslinking agent, for example, polyfunctional isocyanate crosslinking agents, epoxy crosslinking agents, and melamine resin crosslinking agents, if needed. For the same purpose, it is also possible to further add thereto a polyfunctional (meth)acrylate as an internal crosslinking agent in the step of synthesizing the base polymer. The pressure-sensitive adhesive composition may further contain various additives commonly employed in pressure-sensitive adhesives such as pigments, fillers, age resistors, tackifiers, flame-retardants, etc., generally in a total amount of from 0.01 to 100 parts by weight per 100 parts by weight of the base polymer.

The pressure-sensitive adhesive composition to be used in the present invention can further contain a heat-conductive filler in order to elevate the heat conductivity. As the heat-conductive filler, use can be made of the same compounds as the above-mentioned ones employed as the filler to be incorporated into the plastic film for the base material. The particle size and form of the heat-conductive filler are the same as those described above. From the viewpoint of avoiding an increase in the viscosity of the pressure-sensitive adhesive composition, it is preferable that such a filler has a purity of at least 95% by weight. It is recommended that the heat-conductive filler is used generally in an amount of from 10 to 300 parts by weight, preferably from 10 to 120 parts by weight, per 100 parts by weight of the base polymer.

The heat-conductive and pressure-sensitive adhesive sheets of the present invention are those in the form of sheets or tapes which are obtained by transferring or directly applying the above-mentioned pressure-sensitive adhesive composition onto the thin layer of the inorganic material formed one or both of the surfaces of the electrical insulating plastic film to form a pressure-sensitive adhesive composition layer generally having a thickness of 10 to 300 μm on at least one face.

To adhere and fix an electronic part to a heat-radiating member by using the heat-conductive and pressure-sensitive adhesive sheet, the heat-conductive and pressure-sensitive adhesive sheet is inserted between the electronic part and the heat-radiating member, followed by contact bonding, thereby making use of the pressure-sensitive adhesion. Thus, the electronic part and the heat-radiating member can be well fixed while achieving a high heat-conductivity and a high adhesion strength even at high temperatures.

The electronic parts to be adhered and fixed are not particularly restricted. Examples thereof include IC tips, hybrid packages, multi-tip modules, power transistors and sealed-type integrated circuits made of plastics or metals. The present invention can be advantageously applied to the adhesion and fixation of electronic parts with a large heat value, for example, those employed in highly integrated circuits. The heat-radiating members, i.e., another subject to be adhered and fixed, include heat sinks made of metal plates and sheets and radiators. The thickness of the heat sinks generally ranges from 10 μm to 10 mm, preferably from 100 μm to 3 mm, though the present invention is not restricted thereto. The radiators may have arbitrary structures, for example, those provided with cooling fans.

The heat conductive and pressure-sensitive adhesive sheets of the present invention may be used not only in adhering and fixing these electronic parts to the heat-radiating members but also in fixing members in various fields including building materials, vehicles, aircrafts and ships. It is needless to say that the heat-conductive and pressure-sensitive adhesive sheets can achieve the above-mentioned effects too when employed for these purposes.

EXAMPLES

To further illustrate the present invention in greater detail, the following Examples will be given wherein all parts are by weight.

Example 1

A polyimide film containing about 17% by weight of $Al_2O_3$ and having a thickness of 25 μm as a base material was disposed on the base side of a sputtering apparatus. After setting an aluminum target on the sputter electrode, the system was drawn a vacuum to $1\times10^{-3}$ Pa. Next, an argon gas and an oxygen gas were blown thereinto respectively at rates of 15 cc/min and 100 cc/min and thus the inner pressure was maintained at $1\times10^{-1}$ Pa. Under these conditions, a direct voltage of 400V was applied on the sputter electrode to perform glow discharge for 30 seconds, thus effecting sputtering. Thus, a thin layer composed of aluminum oxide having a thickness of 200 A was formed on the base material made of the $Al_2O_3$-containing polyimide film by the reactive magnetron sputtering. Subsequently, the opposite surface of the base material was subjected to the same treatment to give a base material having thin layers (thickness: 200 A) on both surfaces.

One hundred parts of polydimethyldiphenylsiloxane having a molecular weight of 800,000 and 120 parts of MQ Silicone Resin were employed as the base polymers and 2 parts of benzoyl peroxide and 200 pats of xylene were mixed therewith to give a solution of a pressure-sensitive adhesive composition. The MQ silicone resin comprises M unit ($R_3SiO_{1/2}$ wherein R is a methyl group, a phenyl group or the like but most of R are methyl groups) and Q unit ($SiO_{4/2}$) in a M/Q ratio of 0.8. The obtained solution was applied on a release liner having been treated with a fluorine-based releasing agent and dried at 90° C. for 5 minutes and then at 160° C. for 10 minutes in a hot-air dryer to form a pressure-sensitive adhesive composition layer of 50 μm in thickness. Next, this pressure-sensitive adhesive composition layer was adhered to both surfaces of the above-mentioned base material having the thin layers (thickness 200 A) of aluminum oxide on both surfaces. Thus, a heat-conductive and pressure-sensitive adhesive sheet was prepared.

Example 2

A sputtering apparatus was provided in the base side with a polyethylene terephthalate film of 25 μm in thickness. After setting an alloy target composed of 90% by weight of indium and 10% by weight of tin on the sputter electrode, the system was drawn a vacuum to $1\times10^{-3}$ Pa. Next, an argon gas and an oxygen gas were blown thereinto respectively at flow rates of 100 cc/min and 15 cc/min and thus the inner pressure was maintained at $4\times10^{-1}$ Pa. Under these conditions, a direct voltage of 400V was applied on the sputter electrode to perform glow discharge for 30 seconds, thus effecting sputtering. Thus, a thin layer having a thickness of 200 A of an oxide mixture composed of indium oxide and tin oxide was formed on one surface of the base material made of the polyethylene terephthalate film. Subsequently, the procedure of Example 1 was repeated to give a heat-conductive and single-side pressure-sensitive adhesive sheet.

Example 3

A thin layer (thickness: 200 A) of aluminum oxide was formed on a polyimide film employed as abase material (thickness: 25 µm) containing about 17% by weight of $Al_2O_3$ by means of a transverse 270°-polarized electron beam evaporator (maximum output: 16 KW). That is, after drawing a vacuum to $10^{-5}$ Torr, a crucible containing aluminum was set in a water-cooled copper hearth, and the evaporation was effected at an acceleration voltage of 9 KV and a beam current of 1.6 A. Next, the opposite surface of the base material was subjected to the same treatment to give a base material having thin aluminum oxide layers (thickness: 200 A) on both surfaces.

A premix comprising 75 parts of isooctyl acrylate, 20 parts of butyl acrylate, 5 parts of acrylic acid and 0.1 part of 2,2-dimethoxy-2-phenylacetone (photopolymerization initiator) was partly polymerized by exposing to UV light in a nitrogen atmosphere to give a coatable syrup having a viscosity of about 40 P (poise). To 100 parts of this syrup were added 0.2 parts of trimethylolpropane triacrylate (an internal crosslinking agent) and 40 parts of boron nitride (BN) to give a composition for photopolymerization.

This composition for photopolymerization was applied onto one surface of the base material having thin aluminum oxide layers (thickness: 200 A) on both surfaces as prepared above and then photopolymerized by irradiating with UV light having a light intensity of 900 mj/cm² with the use of a high-pressure mercury lamp of 5 mW/cm² in a nitrogen gas atmosphere. Next, it was dried at 130° C. for 5 minutes by using a hot-air circulatory dryer, thus forming a pressure-sensitive adhesive composition layer of 50 µm in thickness. Then, the opposite surface of the base material was subjected to the same treatment to give a heat-conductive and pressure-sensitive adhesive sheet having the pressure-sensitive adhesive composition layers (thickness: 50 µm) on both surfaces.

Example 4

In 210 parts of ethyl acetate, 95 parts of 2-ethylhexyl acrylate and 5 parts of acrylic acid were subjected to solution polymerization in the coexistence of 0.4 parts of 2,2-azobisisobutyronitrile while stirring under nitrogen replacement at 60 to 80° C. to thereby obtain a polymer solution having a viscosity of about 120 P, a degree of polymerization of 99.2% by weight and a solid content of 30.0% by weight. To this solution were added, per 100 parts of the base polymer, 3 parts of a polyfunctional isocyanate crosslinking agent and 60 parts of $SiO_2$ to give a pressure-sensitive adhesive composition solution.

This solution of the pressure-sensitive adhesive composition was applied onto a release liner and then dried at 40° C. for 5 minutes and then at 130° C. for 5 minutes by using a hot-air circulatory dryer, thus forming a pressure-sensitive adhesive composition layer of 50 µm in thickness. This pressure-sensitive adhesive composition layer was adhered to the both surfaces of a base material having thin aluminum oxide layers (thickness: 200 A) on both surfaces as prepared by the method of Example 1 to give a heat-conductive and pressure-sensitive adhesive sheet.

Comparative Example 1

A heat-conductive and pressure-sensitive adhesive sheet was obtained by repeating the procedure of Example 1 but forming no thin aluminum oxide layer of 200 A in thickness on both surfaces of the base material made of the $Al_2O_3$-containing polyimide film.

Comparative Example 2

A heat-conductive and pressure-sensitive adhesive sheet was obtained by repeating the procedure of Example 2 but forming no thin layer of 200 A in thickness of the indium oxide/tin oxide mixture on one surface of the base material made of the polyethylene terephthalate film.

The heat-conductive and pressure-sensitive adhesive sheets obtained in the above Examples 1 to 4 and Comparative Examples 1 and 2 were each subjected to the following retentive force resistance to heat shear test and heat resistance test. The obtained results are shown in Table below.

Retentive Force Resistant to Heat Shear Test

A heat-conductive and pressure-sensitive adhesive sheet (width: 10 mm) was adhered to one lengthwise end of an aluminum plate (125×25×0.4 mm) to obtain an adhesion area of 20×10 mm. After allowing to stand at 80° C. for 30 minutes, a load (500 g) was applied in the lengthwise direction of the adhesive sheet at 80° C. It was examined whether or not the sheet was kept for 120 minutes or longer without dropping. "A" means a case where the sheet was kept for 120 minutes or longer while "B" means a case where the sheet dropped less than 120 minutes.

Heat Resistance Test

By using a heat-conductive and pressure-sensitive adhesive sheet, a transistor in a TO-220 package (in terms of a standard of Joint Electron Device Engineering Council) was adhered and fixed under a contact bonding pressure of 2 kg/cm² to a heat sink which had been immersed in water to obtain a constant temperature. Then, a definite output was supplied to the transistor and the difference (T2−T1) in the transistor temperature (T2) from the temperature of the lower surface of the heat-conductive and pressure-sensitive adhesive sheet (T1) was measured. Next, the heat resistance was calculated in accordance with the following formula.

$$\text{Heat resistance } (°\text{ C.}\cdot\text{cm}^2/\text{W}) = (T2-T1) \times A/P$$

A: transistor area (cm²).

P: electrical power (W) consumed by transistor.

The transistor temperature (T2) was measured by using a thermocouple spot-welded to the metallic base of the transistor package. On the other hand, the temperature of the lower surface of the heat-conductive and pressure-sensitive adhesive sheet (T1) was measured by forming a small hole in the heat sink and inserting a thermocouple thereinto. The thermocouple was placed in the heat sink such that it did not give influence onto the adhered area of the heat-conductive and pressure-sensitive sheet, with the proviso that the location of the thermocouple was as near as possible to the interface between the heat sink and the adhesive sheet.

TABLE

| Sample No. | Retentive Force Resistant to Heat Shear Test | Heat Resistance Test (° C · cm²/W) |
| --- | --- | --- |
| Example 1 | A | 15.0 |
| Example 2 | A | 12.0 |

TABLE-continued

| Sample No. | Retentive Force Resistant to Heat Shear Test | Heat Resistance Test (° C · cm²/W) |
| --- | --- | --- |
| Example 3 | A | 4.5 |
| Exampel 4 | A | 7.6 |
| Comparative Example 1 | B | 15.1 |
| Comparative Example 2 | B | 12.2 |

It can be seen from the results in the above Table that the heat-conductive and pressure-sensitive adhesive sheets of Examples 1 to 4 according to the present invention were each not only maintained for not less than 120 minutes in the retentive force resistant to heat shear test but also achieved satisfactory results depending on the constitution of the materials employed in the heat resistance test. In contrast, the heat-conductive and pressure-sensitive adhesive sheets of Comparative Examples 1 and 2 dropped within 120 minutes in the retentive force resistant to heat shear test due to anchoring fracture between the base material and the pressure-sensitive adhesive composition layer.

As described above, the present invention can provide heat-conductive and pressure-sensitive adhesive sheets which are excellent in heat-conductivity and pressure-sensitive adhesion, exhibit good adhesion between the base material and the pressure-sensitive adhesive composition layer while scarcely undergoing anchoring fracture between the base material and the pressure-sensitive adhesive composition layer, and exhibit high heat resistance. These heat-conductive and pressure-sensitive adhesive sheets are widely usable in fixing electronic parts, in particular, fixing electronic parts to heat-radiating members and for fixing members in various fields including building materials, vehicles, aircrafts and ships.

While the invention has been described in detail and with reference to specific embodiments thereof, it will be apparent to one skilled in the art that various changes and modifications can be made therein without departing from the spirit and scope thereof.

What is claimed is:

1. A heat-conductive and pressure-sensitive adhesive sheet comprising an electrical insulating plastic film having formed on one or both of the surfaces thereof (1) at least one thin layer composed of an electrical insulating inorganic material selected from the group consisting of ceramics and metal oxides other than ceramics, and (2) a pressure-sensitive adhesive composition layer formed on said thin layer.

2. The heat-conductive and pressure-sensitive adhesive sheets of claim 1, wherein said electrical insulating plastic film is a polyimide(amide) film.

3. The heat-conductive and pressure-sensitive adhesive sheet of claim 1, wherein said electrical insulating plastic film contains from 2 to 50% by volume of a filler.

4. The heat-conductive and pressure-sensitive adhesive sheet of claim 1, wherein said pressure-sensitive adhesive composition comprises a base polymer and a heat-conductive filler, and the content of the heat-conductive filler is from 10 to 300 parts by weight per 100 parts by weight of the base polymer.

5. A method for fixing electronic parts to heat-radiating members, which comprises adhering and fixing said electronic parts to said heat-radiating members via a heat-conductive and pressure sensitive sheet comprising an electrical insulating plastic film having formed on one or both of the surfaces thereof (1) at least one thin layer composed of an electrical insulating inorganic material selected from the group consisting of ceramics and metal oxides other than ceramics, and (2) a pressure-sensitive adhesive composition layer formed on said thin layer.

6. The method of claim 5, wherein said electrical insulating plastic film is a polyimide(amide) film.

7. The method of claim 5, wherein said electrical insulating plastic film contains from 2 to 50% by volume of a filler.

8. The method of claim 5, wherein said pressure-sensitive adhesive composition comprises a base polymer and a heat-conductive filler, and the content of the heat-conductive filler is from 10 to 300 parts by weight per 100 parts by weight of the base polymer.

* * * * *